US006175504B1

United States Patent
Hood, III et al.

(10) Patent No.: US 6,175,504 B1
(45) Date of Patent: Jan. 16, 2001

(54) MULTI-MEMBER AXIAL FLEXIBLE CIRCUIT

(75) Inventors: Charles D. Hood, III, Cedar Park; Jason Q. Paulsel, Round Rock, both of TX (US)

(73) Assignee: Dell USA, L.P., Round Rock, TX (US)

( * ) Notice: Under 35 U.S.C. 154(b), the term of this patent shall be extended for 0 days.

(21) Appl. No.: 09/154,690

(22) Filed: Sep. 17, 1998

(51) Int. Cl.[7] .................................................. H05K 1/02
(52) U.S. Cl. ..................... 361/749; 361/683; 174/254; 439/31; 439/77; 439/474
(58) Field of Search ................................ 361/680–683, 361/749; 439/31, 165, 471, 474, 67, 77, 493; 16/223, 295, 342; 345/169, 901, 905; 364/708.1; 349/150; 174/117 FF, 254

(56) References Cited

U.S. PATENT DOCUMENTS

| | | | |
|---|---|---|---|
| 3,873,889 | * | 3/1975 | Leyba ........................................ 439/77 |
| 4,756,940 | | 7/1988 | Payne et al. ............................. 428/78 |
| 4,825,395 | | 4/1989 | Kinser, Jr. et al. ............... 364/708.1 |
| 4,852,033 | | 7/1989 | Saitou ................................. 364/708.1 |
| 4,864,523 | | 9/1989 | Sasaki ................................ 364/708.1 |
| 4,986,763 | | 1/1991 | Boyle ..................................... 439/165 |
| 5,001,659 | | 3/1991 | Watabe .............................. 364/708.1 |
| 5,237,488 | * | 8/1993 | Moser et al. .......................... 361/681 |
| 5,379,183 | | 1/1995 | Okonsky et al. ..................... 361/681 |
| 5,448,511 | * | 9/1995 | Paurus et al. ........................... 439/77 |
| 5,490,036 | | 2/1996 | Lin et al. ................................ 361/680 |
| 5,525,760 | * | 6/1996 | Rohatgi et al. ....................... 174/254 |
| 5,581,440 | | 12/1996 | Toedter ................................. 361/683 |
| 5,616,050 | | 4/1997 | Suski .................................... 439/495 |
| 5,748,444 | * | 5/1998 | Honda et al. ......................... 361/687 |
| 5,815,735 | * | 9/1998 | Baker ...................................... 439/31 |
| 5,859,669 | * | 1/1999 | Prentice ................................ 348/469 |
| 5,897,382 | * | 4/1999 | Takahashi ............................... 439/31 |
| 5,914,853 | * | 6/1999 | Motoe et al. ......................... 361/680 |
| 5,917,968 | * | 6/1999 | Wood .................................... 361/680 |
| 5,995,373 | * | 11/1999 | Nagai ................................... 361/755 |

OTHER PUBLICATIONS

McCray, Rolla P.; Two–Piece Flex Circuit Bobbin For Portable Computers; Ser. No. 08/942,258 (copies not included).

Rogers, Rick and Schlesener, Maria C.; Slide Snap–In Cable Bobbin Assembly For A Portable Computer; Ser. No. 09/037,224 (copies not included).

\* cited by examiner

Primary Examiner—Jeffrey Gaffin
Assistant Examiner—John B. Vigushin
(74) Attorney, Agent, or Firm—Skjerven, Morrill MacPherson LLP; Ken J. Koestner; Margaret M. Kelton

(57) ABSTRACT

A signal communication structure for communicating signals between a base and a display of an electronic device, the base and display being connected in an axially hinged connection includes an axial member formed from a flexible material and includes a communication line for signal communication with the axial member adapted to flex about the axially hinged connection between the base and the display. The axial member also includes a plurality of appendage members connected to and extending from the axial member. The appendage members include a communication line coupled to the communication line of the axial member for signal communication between the plurality of appendage members via the axial member.

21 Claims, 6 Drawing Sheets

MULTI-MEMBER AXIAL FLEXIBLE CIRCUIT

BACKGROUND OF THE INVENTION

1. Field of the Invention

This invention relates in general to computer systems, and more specifically to a printed circuit board for a portable computer.

2. Description of the Related Art

Personal computer systems have attained widespread use. A personal computer system can usually be defined as a desktop or portable microcomputer that includes a system unit having a system processor or central processing unit (CPU) with associated memory, a display panel, a keyboard, a hard disk storage device or other type of storage media such as a floppy disk drive or a compact disk read only memory (CD ROM) drive. These personal computer systems are information handling systems which are designed primarily to give independent computing power to a single user or group of users.

A portable computer is a self-contained personal computer designed to be easily moved to and operated in various locations. Portable computers are often referred to as laptop, notebook or subnotebook computers. To be portable, these computers are small, compact, and lightweight. The conventional portable computer has a base portion and a lid portion that pivotally opens from the base portion. The lid portion contains a flat panel display such as a liquid crystal display (LCD) or other relatively thin display.

To generate an image on the display of a portable computer, electrical signal and power are provided from the base. The mechanism to allow this must be stable and robust enough to withstand thousands of opening and closing cycles without showing degradation of performance. Currently, many portable computers use flexible printed circuit boards with multiple electrical conductive circuit traces embedded in the flexible circuit boards to connect the base portion of the computer to the display portion. On one end of the flexible circuit are the connections to a motherboard in the base. The other end of the flexible circuit includes connections to an LCD screen, the inverter board for the back light, and several LED displays which indicate the operational status of the computer.

In some portable computers, the flexible circuit is adhered to and wrapped inside and around a tubular bobbin device. Repeated opening and closing of the hinged top wraps and unwraps the flexible circuit around the bobbin. The bobbin method is particularly susceptible to stress concentrations resulting from improper assembly of the flexible circuit to the bobbin. Variations in circuit assembly can vary the life of the flexible circuit by an order of magnitude. Furthermore, shielding must be supplied around the flexible circuit to protect against electromagnetic interference (EMI) with high-speed video signals such as Low Voltage Differential Signaling (LVDS) signals. Such shielding is generally supplied by a copper or other shielding medium externally encasing the electrically conductive signals between the base portion and the display portion. In bobbin-wound flexible circuit connections, the copper shielding might be external to the flexible circuit but inside the bobbin to keep the copper shielding in place. This creates an extra step in the manufacturing of the notebook computer.

In other portable computers, the flexible circuit is passed from the computer base to the display by passing it through a protected area in a flat configuration so that the circuit bends unidirectionally. The severe bending at particular points along the flexible length of the flexible circuit make this method more susceptible to stress concentrations. Reliability is substantially affected by changes over time to the circuit's physical geometry. Like the bobbin-wound circuit, a straight pass-through flexible circuit requires EMI sheilding.

What is needed is a standardized flexible circuit able to reliably withstand thousands of rotations of the lid portion without variance of performance due to assembly techniques that is more robust than either the straight pass method or the bobbin wound method. Further, a standardized flexible circuit is needed that incorporates EMI shielding without requiring further steps in manufacturing.

SUMMARY OF THE INVENTION

A signal communication structure for communicating signals between a base and a display of an electronic device, the base and display being connected in an axially hinged connection includes an axial member formed from a flexible material and includes a communication line for signal communication with the axial member adapted to flex about the axially hinged connection between the base and the display. The axial member also includes a plurality of appendage members connected to and extending from the axial member. The appendage members include a communication line coupled to the communication line of the axial member for signal communication between the plurality of appendage members via the axial member.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
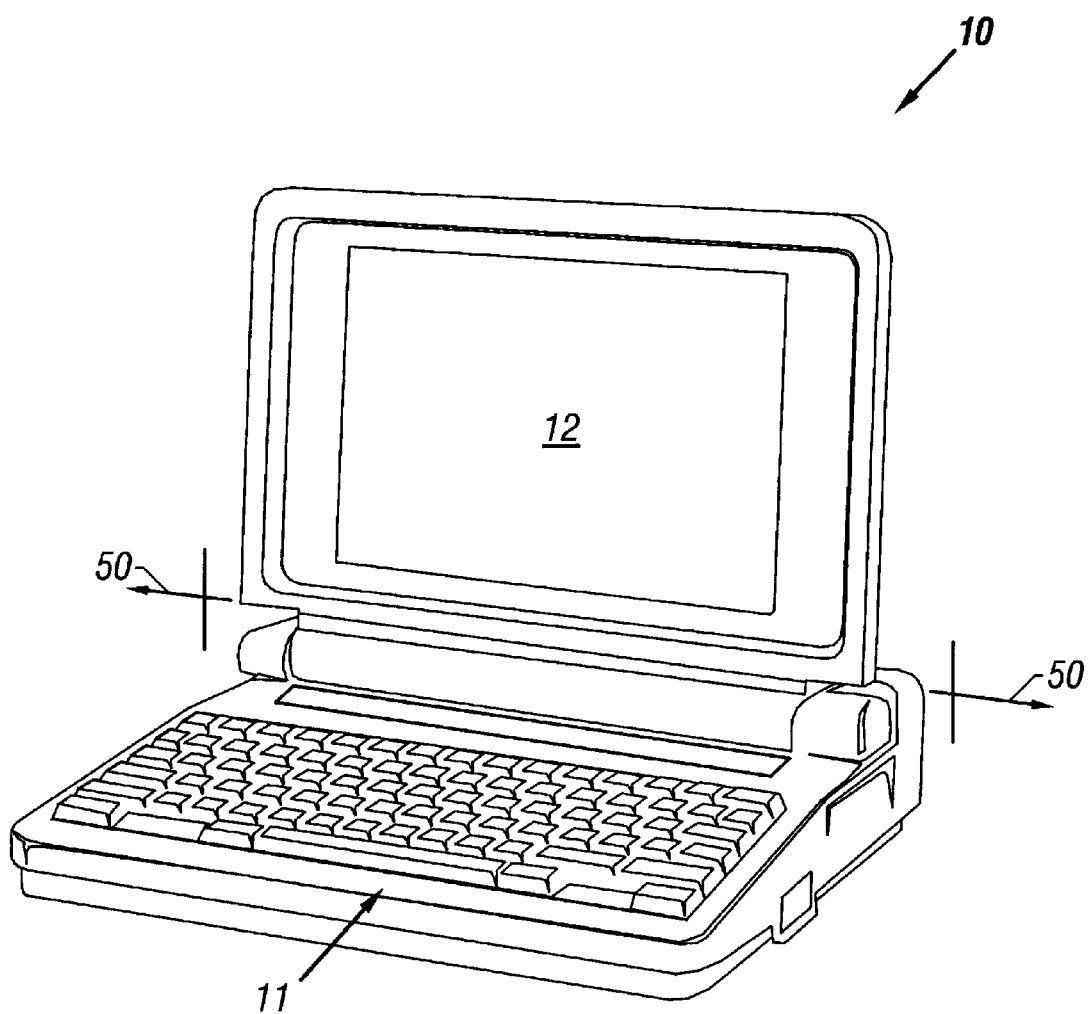
FIG. 1 is a perspective view of a personal computer utilizing an axial flexible circuit to electrically couple the display and the base according to an embodiment of the present invention.

FIG. 1 shows a portable personal computer (PC) 10 representing features of an embodiment of the present invention. The PC 10 includes a base 11, a display 12, and a hinge mechanism allowing the display 12 to be pivotally attached to the base 11. As will be described below, the PC 10 also includes a flexible circuit, hereinafter referred to as an axial flexible circuit, that is not shown but is located between the base 11 and the display 12 along the line 50 in FIG. 1. Further, the PC 10 holds a processor and a memory that are not shown.

Figure 2:
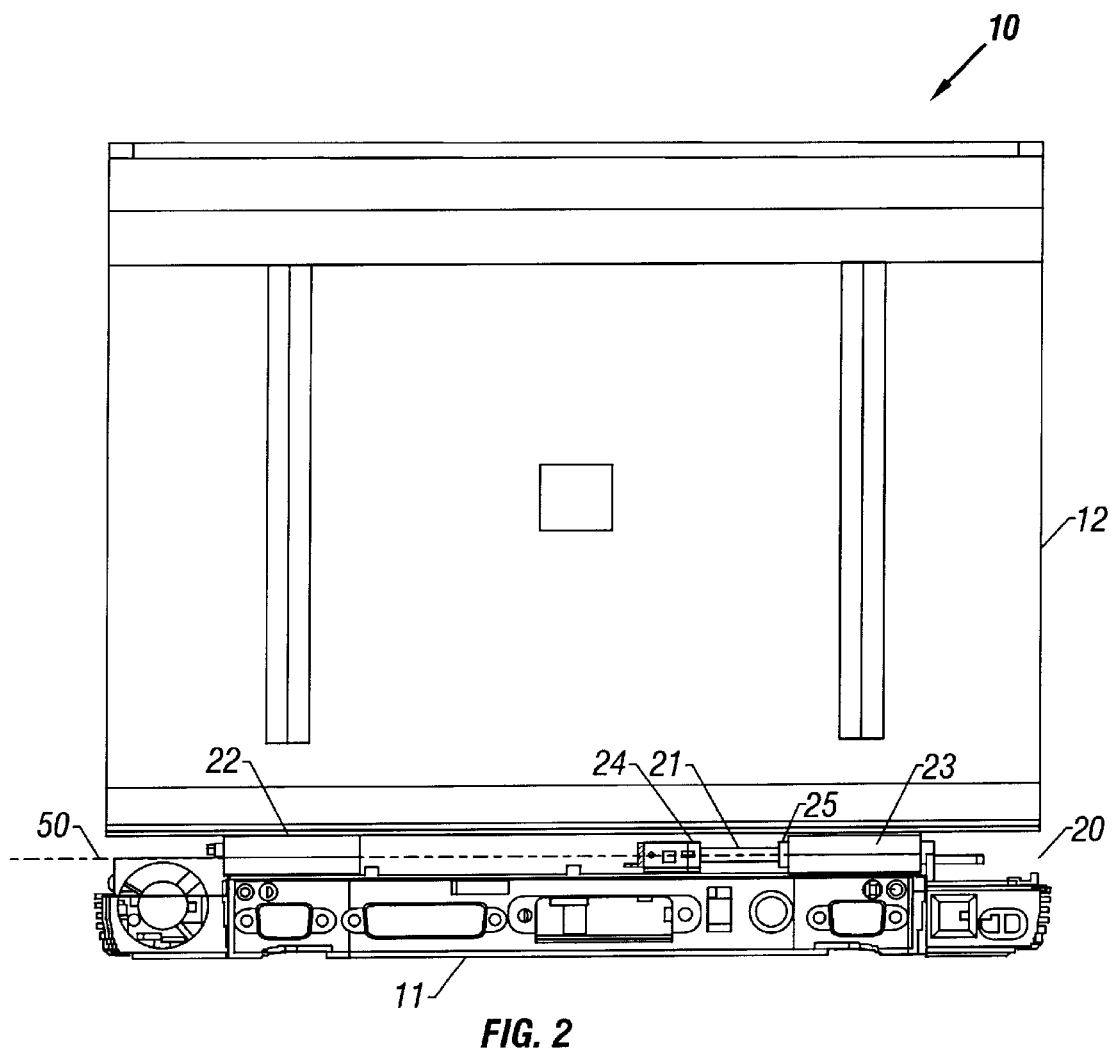
FIG. 2 is a view of the rear hinge area of the PC in FIG. 1 showing the axial flexible circuit.

FIG. 2 represents a view of the PC 10, the base 11, the display 12, and hinge area 20 showing, a portion of the axial flexible circuit 21. The outer sides of the PC 10 are shown hingedly attached on the left and right sides of the PC via two conventional clutch hinges 22 and 23. It is understood that the display 12 and the base 11 may be hingedly attached via a number of other types of hinges, for example, piano hinges, bobbin hinges or barrel-type hinges. It is further understood that the type of hinge and other considerations may dictate shifting the location of the axial flexible circuit 21 along the axis area 50.

For convenience, the angle between the display 12 and the base 11 will be referred to as 0° in the fully closed position, 90° in the vertical position, and 180° in the fully open position. FIG. 2, demonstrates that axis 50, located in the hinge area 20, is the axis of rotation for both the hinge 23, shown in FIG. 2 to be on the right, and the hinge 22, which is shown in FIG. 2 as on the left, as well as the axis of rotation for the axial flexible circuit 21. As shown, PC 10 is in a position rendering the base 11 and the display 12 pivotally separated at 90°. FIG. 2 shows only a portion of the axial flexible circuit 21, i.e., the portion that sustains axial flexion upon opening and closing the PC 10. As more thoroughly discussed below, this visible portion of the axial flexible circuit 21 is folded in an accordion manner and secured at both ends. When the display 12 is closed, the axial flexible circuit 21 twists because the portion of the axial flexible circuit 21 attached to the base portion 11 of the PC, shown in FIG. 2 as area 24 will remain in a perpendicular position relative to the base, while area 25 will rotate with the display 12 and become coplanar with the base 11.

Figure 3:
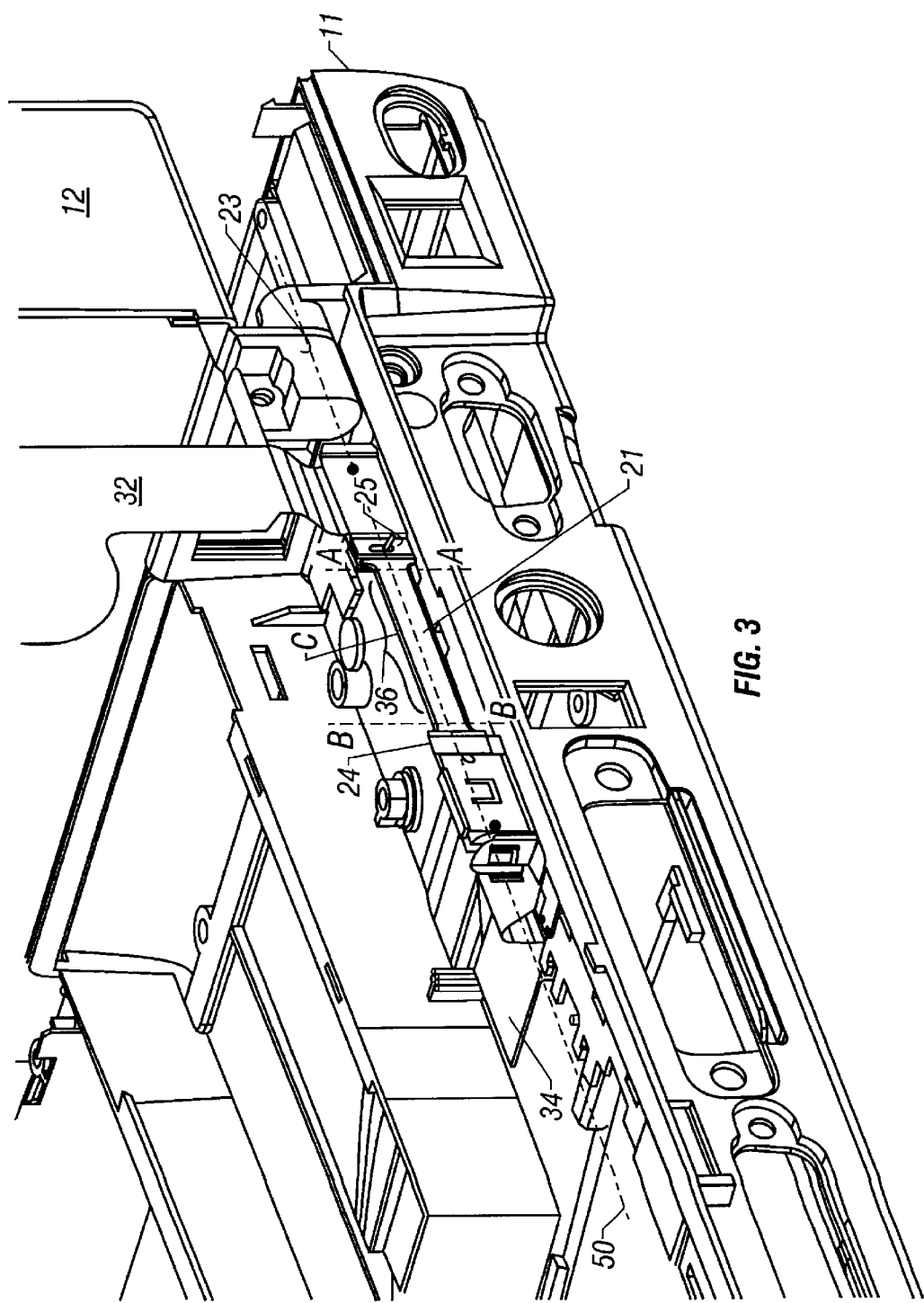
FIG. 3 is a partially cutaway rear perspective view of the multi-member axial flexible circuit as it would appear in the PC.

FIG. 3 shows a cut-away rear perspective view of the of the PC 10 as well as a portion of the display 12 and base 11. The axial flexible circuit 21 is shown extending into the display 12, where electrically conductive lines 32 are transmitted to the display 12, and electrically conductive lines 34 are transmitted to the base 11. FIG. 3 shows the area of the axial flexible circuit 21 that twists as located between lines A and B. This is the axial flexion portion of the circuit 21, hereinafter referred to as axial flexion portion 36. It can be appreciated that both the portion of the axial flexible circuit 21 that goes into the display 12 as well as the portion of the axial flexible circuit that goes into the base 12 can be positioned to extend away from the portion of the axial flexible circuit 21 axial flexion portion 36 in different ways and remain within the scope of the present invention. For example, the axial flexion portion 36 of the axial flexible circuit 21 could be positioned along the hinge axis 50 in manner that necessitates the display circuitry to extend in an angular direction from the axial flexion portion 36 instead of a perpendicular direction relative to the axial flexion portion 36.

Figure 4:
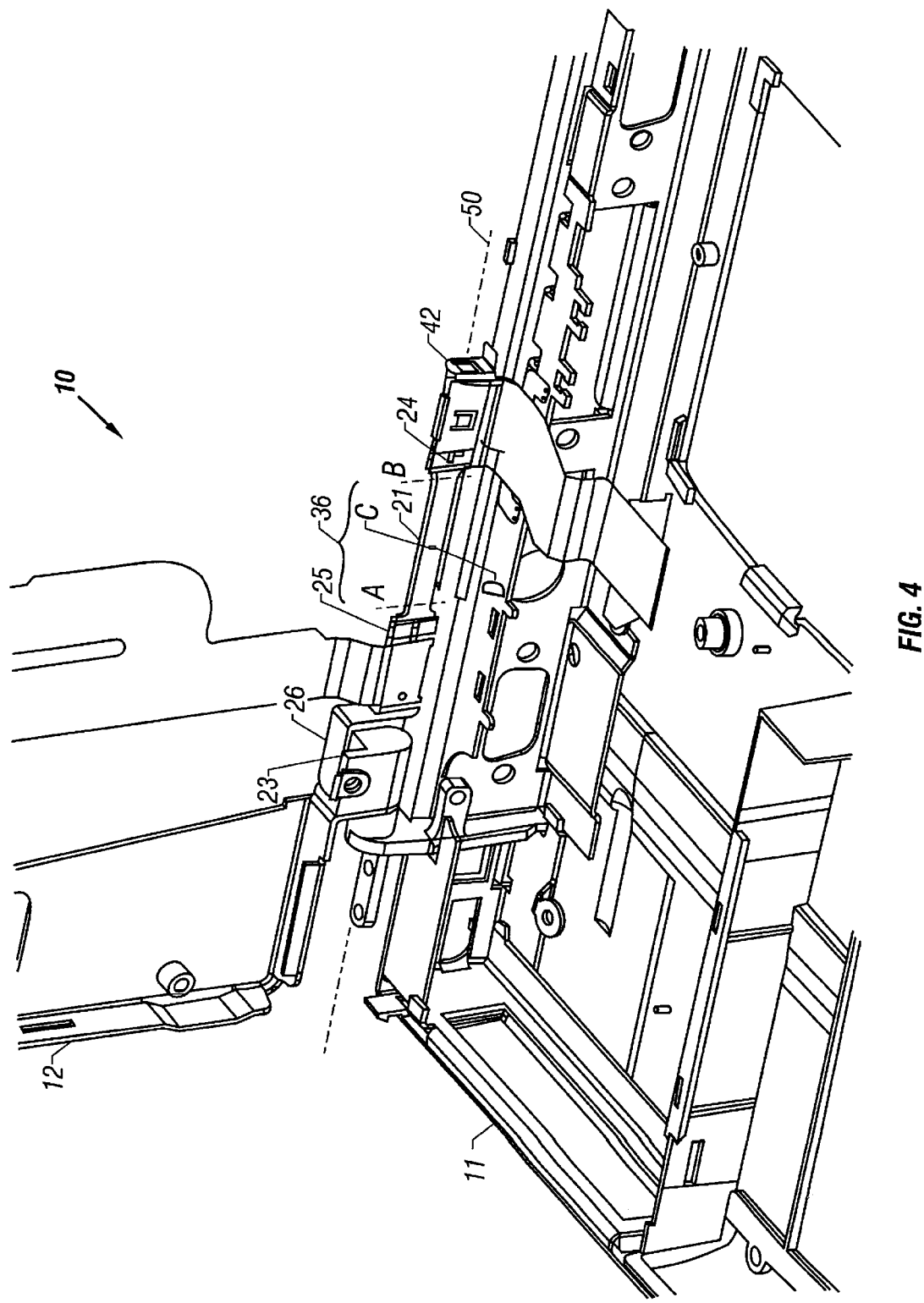
FIG. 4 is a partially cutaway frontal perspective view of the multi-member axial flexible circuit as it would appear in the PC.

With reference to FIG. 4, a frontal cutaway perspective view of the PC 10 is shown. The close-up view of the hinge area 20 shows that the axial flexible circuit 21 is coupled to the base 11 by a brace 42 that keeps the portion of the axial flexible circuit 21 that enters the base 11 stationary. The portion of the axial flexible circuit that is nearest the axial flexion portion 36, is held in place by a retaining pin or rivet 24, shown in FIG. 4 as on the left-hand side of the brace 42. The portion of the axial flexible circuit that extends into the display 12 is secured to a brace 26 and coupled to the display 12 through another retaining pin or rivet 25. In the embodiment shown in FIG. 4, the axial flexible circuit 21 is shown coupled to the display 12 through a brace apparatus 26, thereby pivotally attaching axial flexion portion 36 of the axial flexible circuit 21 to the display 12. In other embodiments, however, the axial flexion portion 36 of the axial flexible circuit 21 could be pivotally attached to both the display 12 and the base 11 using other structures. For example, instead of utilizing braces to attach the axial flexible circuit 21 along the hinge axis 50, the axial flexible circuit could be incorporated into a hinge.

Figure 5:
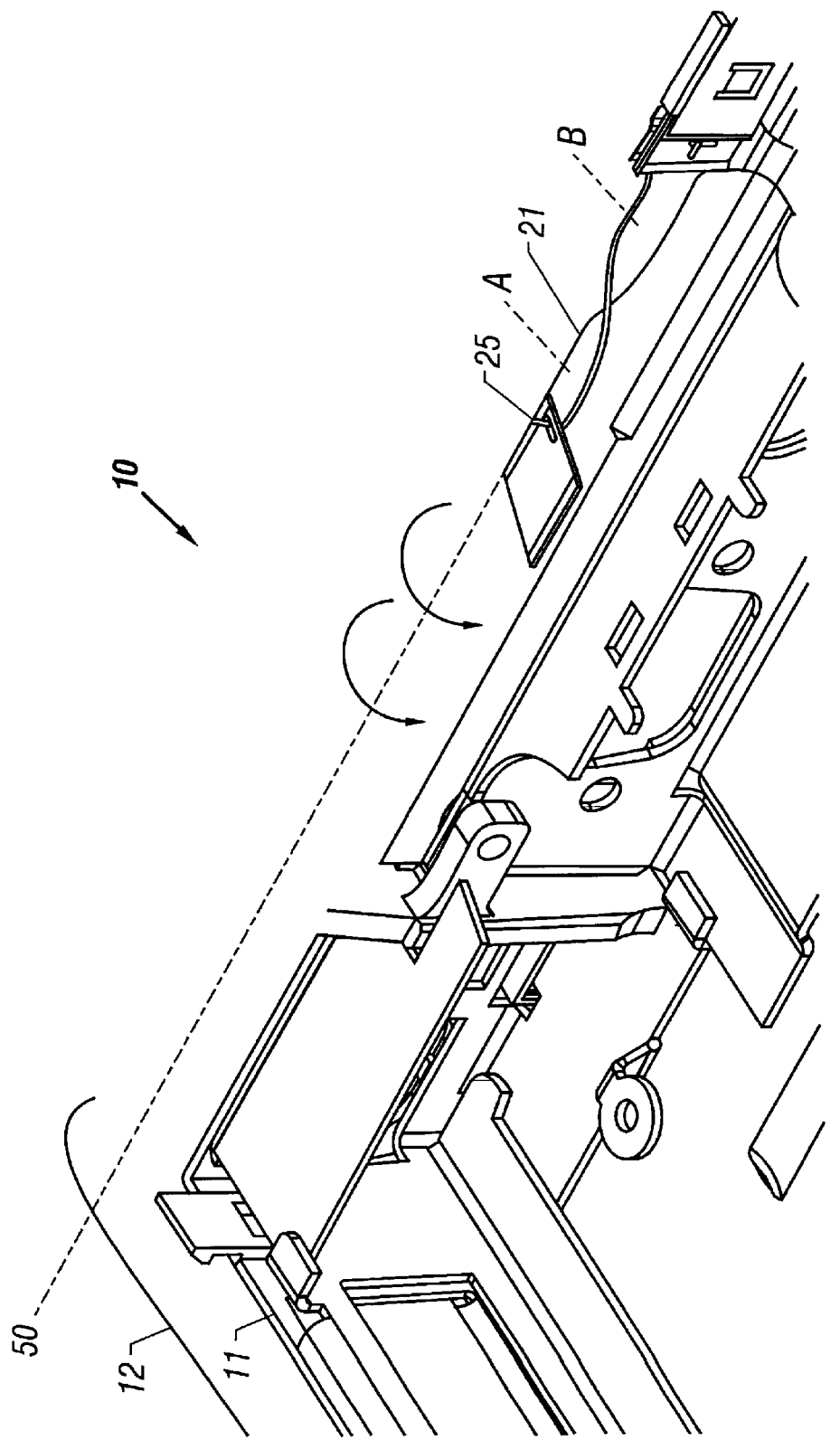
FIG. 5 is a frontal perspective view of the multi-member axial flexible circuit as it would appear in a PC after the display portion of the PC were closed, thereby causing the axial flexible circuit to twist along, the hinge axis.

Referring now to FIG. 4 and FIG. 5 in combination, the physical action of the axial flexible circuit when opening and closing the display portion 12 of the PC 10 is described. Closing the PC 10, shown in FIG. 4, to 0° so that the base member 11 and the display 12 are approximately coplanar twists the axial flexible circuit 21 axially along axis 50. The twisted view of the axial flexible circuit 21 is shown in FIG. 5. For the embodiment shown in FIG. 5, closing the PC 10 causes the area between point A and point B to twist because the riveted area 25 of the axial flexible circuit 21, which is fixedly attached to the display 12, is moved from a perpendicular orientation relative to the base 11 to a coplanar position relative to the base 11, i.e. closed. It is appreciated, however, that numerous other placements of the axial flexible circuit 21 are possible. For example, the axial flexible circuit 21 could be placed so the circuit axially twists when the PC is at 90°, while remaining at straight when the PC 10 is at 0°. In such an example, the closing of the PC 10 causes the axial flexible circuit 21 to untwist.

Referring now to FIG. 5, it is clear that closing the display 12 axially twists the axial flexible circuit 21 by a single twist. Opening the display 12 beyond 90° so that the angle between the base 11 and the display 12 form an angle greater than 90° between the base 11 and the display 12 also twists the axial flexible circuit by a single twist in the circuit if the circuit is not extended beyond a full 180°. Rotating the display from an open 90° backward causes an axial twist between point A and point B of the axial flexible circuit 21 in the opposite direction than that caused when closing the display 12.

The distance from point A to point B on the axial flexible circuit 21 in FIGS. 3, 4 and 5, as well as the thickness of the circuit in the area between points A and B, are factors for determining the maximum angle of rotation to which the display 12 and base 11 may pivot without causing injury to the axial flexible circuit 21. In one embodiment, the length from point A to point B is approximately 30 mm. and the width of the axial flexible circuit 21, shown in FIG. 4 as the length from point C to point D, is 5 mm. Thus, the maximum angle of rotation is a function of the length and width of the rotatable area of the axial flexible circuit 21. Further, the sizes and functional parameters are variable, depending on space requirements and angle desired. In other embodiments, the length and width of the axial flexible circuit 21 change as the parameters of space and angle of rotation change. Thus, one skilled in the art, given the embodiments presented, can design the dimensions for the axial flexible circuit that allow the display 12 to assume a plurality of positions relative to the base 11, from 0° to 360°, independent of concern for damaging the flexible circuit 21.

Figure 6:
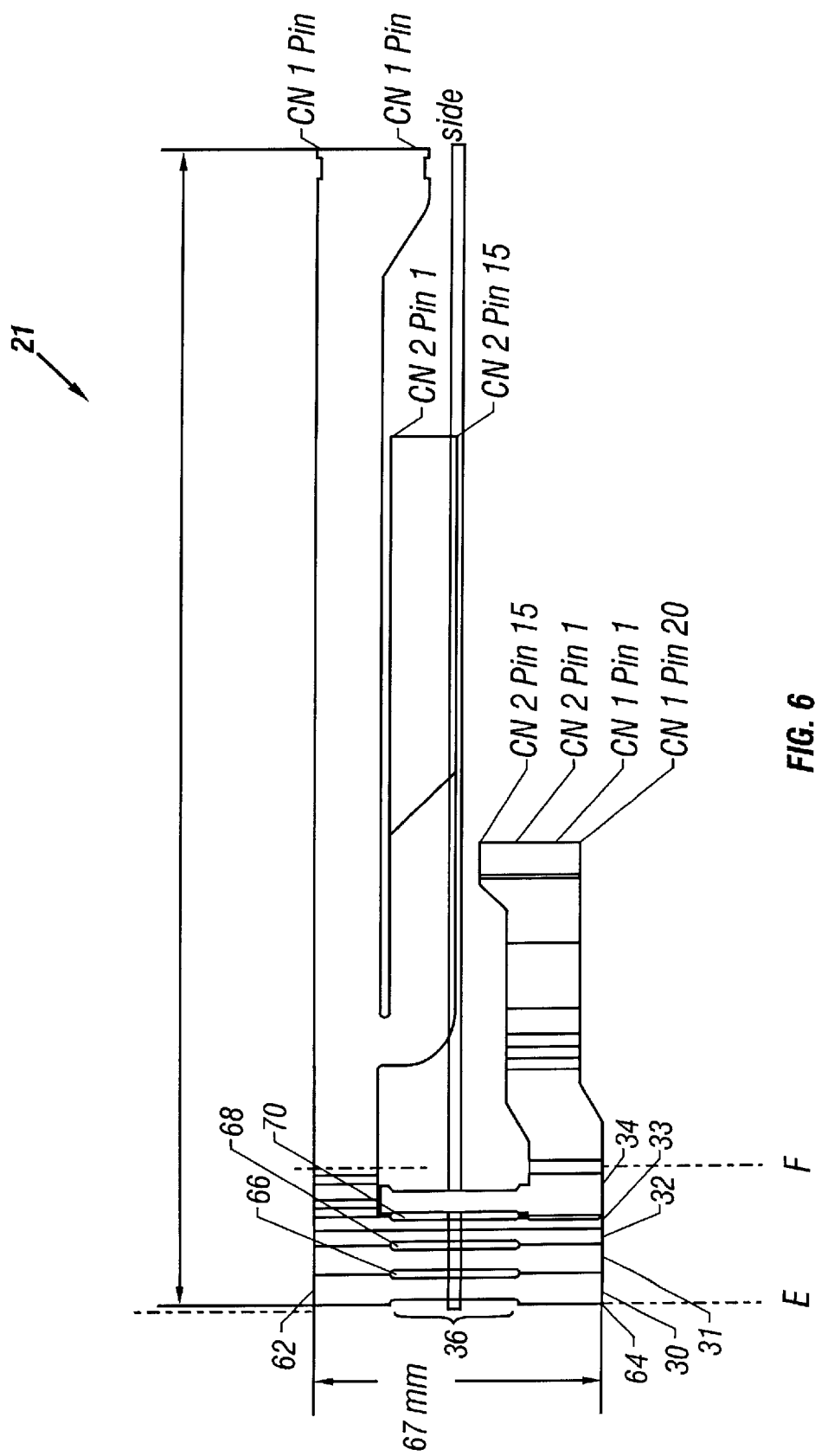
FIG. 6 is a schematic view of the flexible circuit board showing the circuit board prior to preparation for assembly and the location of the signal lines.

With reference to FIG. 6, a schematic view of the axial flexible circuit 21 shows a view of the circuit 21 as it would appear prior to assembly including portions of the circuit that are connected to the base 11 and the display 11. The location of the electrically conductive signal lines through the area to be folded are outlined as follows: Ground 30, LVDS (Low Voltage Differential Signaling) 31, Power 32, Inverter 33 and Ground 34. The area of the axial flexible circuit that is folded is shown in FIG. 6 as between lines E and F. In order to achieve the proper width of the axial flexion portion 36, lengthwise holes are cut between the signal areas. These lengthwise holes are shown as area 66, between Ground 30 and LVDS 31; area 68, between LVDS 3 1 and Power 32; and area 70, between Inverter 33 and Ground 34. FIG. 6 also shows the distance between side 62 and side 64 of the area that is folded to be approximately 67 mm in length. This distance can be any suitable length.

In some embodiments, ground signal line 30 and a ground signal line 34 are positioned as the first and last signals so that when the circuit is folded, the ground signals encase the other signals. In these embodiments, the order of the electrically conductive signal lines may be altered so long as the ground signal lines 30 and 34 remain on the exterior sides of the folded area of the axial flexible circuit 21. Encasing the other signals through folding serves two purposes. First, the folding increases the longevity of the axial flexible circuit 21 by increasing the thickness, thereby making the circuit more robust and able to withstand axial twisting. Second, folding the circuit so that the ground signals encase the other signals protects the interior signals, including high speed video signals, from electromagnetic interference (EMI). One type of fold that enables shielding is an accordion fold. It is appreciated, however, that there are other ways in which to fold the circuit that also result in EMI shielding. The high speed video signals shown in FIG. 6 are LVDS signals, however other video signals may be used. For example, TMDS (Transition Minimized Differential Signaling) video signals could replace LVDS. Moreover, the design of the axial flexible circuit 21 could be utilized in numerous electronic devices aside from portable personal computers. Any electronic device that has a hinge area may utilize the described axial flexible circuit.

The above description is intended to be illustrative of the invention and should not be taken to be limiting. Other embodiments within the scope of the present invention are possible.

What is claimed is:

1. A signal communication structure for communicating signals between a base and a display of an electronic device, the base and display being connected in an axially hinged connection, the signal communication structure comprising:

an axial member formed from a flexible material, the axial member adapted to flex about the axially hinged connection between the base and the display, wherein the axial member includes a crease extended in the direction of the axis of the axial member to form an accordion folded flexible structure, and the axial member includes a plurality of communication lines and one or more ground lines wherein the one or more ground lines encase the plurality of communication lines when the axial member is accordion folded; and a plurality of appendage members connected to and extending from the axial member, the appendage members including a plurality of communication lines coupled to the plurality of communication lines of the axial member for signal communication between the plurality of appendage members via the axial member.

2. A signal communication structure according to claim 1 wherein:

the axial member includes an aperture aligned with the crease, the aperture reducing the size of the folded flexible structure and increasing the flexure of the axial member.

3. A signal communication structure according to claim 1 wherein:

the axial member is secured on a first end and a second end to permit axial twisting of at least a portion of the axial member, the axial twisting allowing pivotal movement between the base and the display of the electronic device along an axis of the axially hinged connection.

4. An electronic device comprising:

a base;

a display connected to the base by an axially hinged connection; and a signal communication structure for communicating signals between the base and the display, the signal communication structure comprising:

an axial member formed from a flexible material and including a plurality of communication lines for signal communication and one or more ground lines, the axial member adapted to flex about the axially hinged connection between the base and the display, wherein the axial member forms a folded flexible structure, wherein the folds are in an accordion manner such that the one or more ground lines encase the plurality of communication lines; and a plurality of appendage members connected to and extending from the axial member, the appendage members including a plurality of communication lines coupled to the plurality of communication lines of the axial member for signal communication between the plurality of appendage members via the axial member, the plurality of appendage members further including one or more ground lines coupled to the one or more ground lines of the axial member.

5. An electronic device according to claim 4 wherein:

the axial member includes a crease extended in the direction of the axis of the axial member to form the folded flexible structure.

6. An electronic device according to claim 5 wherein:

the axial member includes an aperture aligned with the crease, the aperture reducing the size of the folded flexible structure and increasing the flexure of the axial member.

7. An electronic device according to claim 4 wherein:

the axial member includes a plurality of communication lines; and the plurality of appendage members each include a plurality of communication lines, the communication lines of the axial member each connecting to a line of the plurality of communication lines of the appendage members.

8. A flexible signal communication medium capable of transmitting a plurality of signals comprising:

a transverse section of the flexible medium;

a plurality of portions of the flexible medium extending outwardly from the transverse section, the portions capable of transmitting the plurality of signals through the transverse section, the transverse section having a plurality of cut-out portions; and the plurality of cut-out portions of the transverse section are folded, wherein the folds are in an accordion manner, and wherein securing ends of the folded transverse section permits axial twisting of at least a portion of the transverse section between the portions of the flexible medium extending outwardly, thereby allowing pivotal movement.

9. The apparatus of claim 8 wherein:

the cut-out portions are aligned with areas of the folded transverse section; and the cut-out portions serve to reduce the width of a central area of the transverse section thereby manifesting greater rotational flexibility of the central area.

10. The apparatus of claim 8 wherein the plurality of portions of extending outwardly from the transverse section are coupled to a first and a second end of the transverse section, the transverse section being secured at the first end and the second end, the portion of the transverse section that axially twists being between the first end and the second end.

11. The apparatus of claim 8 wherein:

the plurality of portions of the flexible medium extending outwardly are electrically coupled to electronic components.

12. The apparatus of claim 11 wherein:

the plurality of portions of the flexible medium electrically coupled to electronic components are pivotally coupled to a display member and a base member.

13. The apparatus of claim 11 wherein the transverse section is aligned along an axis of rotation extending from the first end to the second end.

14. The apparatus of claim 8 wherein the accordion folding of the transverse section provides electromagnetic shielding in the flexible medium by encasing the plurality of signals transmitted through the transverse section with one or more ground lines.

15. The apparatus of claim 4 wherein the signals include at least one of Low Voltage Differential Signaling (LVDS) signals and Transition Minimized Differential Signaling (TMDS) signals.

16. A method for electrically coupling a pivotal display to a base member comprising:

providing a flexible medium for transmitting electrical signals, the flexible medium having an elongated first end, an elongated second end, and a transverse section located between the first end and the second end;

electrically coupling the first end to the second end through a plurality of signal lines, the plurality of signal lines included in as part of the medium;

accordion folding the transverse section;

securing the ends of the transverse section; and permitting axial twisting of a portion of the transverse section, thereby allowing pivotal movement between the first end and the second end of the flexible medium.

17. The method of claim 16 further comprising:

electrically coupling an elongated end to the base member; and electrically coupling an elongated end to the pivotal display.

18. The method of claim 16 further comprising:

folding the transverse section of the flexible circuit to provide electromagnetic shielding of the transmitted electrical signals by encasing the electrical signals with ground lines.

19. A computer system, comprising:

a system bus;

at least one processor;

at least a memory;

a base member;

a display pivotally mounted to the base member;

a flexible circuit containing a plurality of signals having a first end and a second end, the flexible circuit electrically coupling the display to the base member, the flexible circuit having a transverse section between the first end and the second end, the transverse section being secured at one end to the base member and secured at another end to the display such that pivotal movement between the base member and the display causes axial twisting of the transverse section, wherein the transverse section is folded in an accordion manner.

20. The computer system of claim 19 wherein the transverse section is folded to provide electromagnetic shielding of particular signals in the flexible circuit.

21. The computer system of claim 20 wherein the particular signals are one of Low voltage Differential Signaling (LVDS) signals and Transition Minimized Differential Signaling (TMDS) signals.

* * * * *